US006643924B2

(12) United States Patent
Hirabayashi

(10) Patent No.: US 6,643,924 B2
(45) Date of Patent: Nov. 11, 2003

(54) METHOD OF MANUFACTURING A DISTRIBUTED CONSTANT FILTER CIRCUIT MODULE

(75) Inventor: Takayuki Hirabayashi, Tokyo (JP)

(73) Assignee: Sony Corporation, Tokyo (JP)

( * ) Notice: Subject to any disclaimer, the term of this patent is extended or adjusted under 35 U.S.C. 154(b) by 120 days.

(21) Appl. No.: 09/903,251

(22) Filed: Jul. 11, 2001

(65) Prior Publication Data

US 2001/0045010 A1 Nov. 29, 2001

Related U.S. Application Data

(62) Division of application No. 09/514,382, filed on Feb. 28, 2000, now Pat. No. 6,377,141.

(30) Foreign Application Priority Data

Mar. 3, 1999 (JP) ........................................ P11-055590

(51) Int. Cl.[7] ................................................ H05K 3/10

(52) U.S. Cl. ............................ 29/846; 29/829; 29/825; 29/847; 29/848; 29/852; 333/204; 333/202

(58) Field of Search .......................... 29/825, 846, 600, 29/601, 830, 852, 847, 848, 829; 333/204, 202, 219; 257/728

(56) References Cited

U.S. PATENT DOCUMENTS 4,352,076 A * 9/1982 Saitoh et al. ............... 333/204
5,812,037 A * 9/1998 Block ......................... 333/204
5,825,264 A * 10/1998 Yamazaki et al. .......... 333/204
6,041,224 A * 3/2000 Wada ......................... 455/327
6,483,403 B2 * 11/2002 Hirabayashi et al. ....... 333/204

* cited by examiner

*Primary Examiner*—Carl J. Arbes
*Assistant Examiner*—Tai V Nguyen
(74) *Attorney, Agent, or Firm*—Sonnenschein, Nath & Rosenthal LLP

(57) ABSTRACT

A distributed constant filter capable of being connected to a wiring pattern and the like while simultaneously achieving miniaturization, stable performance and assurance of the reliability and a manufacturing method of the distributed constant filter are provided. In a triplate structure band-pass filter, in place of a high impedance pattern which is, in the prior art, formed on the same face as that of a low impedance pattern in an inner layer, conductor patterns extending in the thickness direction of a stacked substrate are formed. Each of the conductor patterns functions as a via pattern connecting the low impedance pattern in the inner layer and a wiring pattern in the surface layer and also functions as a high impedance line. As long as the filtering characteristic is the same, the line overall length (distance in a plane) of the conductor patterns can be made shorter than the conventional line overall length and the area occupied by the conductor patterns can be reduced. A change in the filtering characteristic which occurs when via patterns are separately provided does not occur.

17 Claims, 9 Drawing Sheets

METHOD OF MANUFACTURING A DISTRIBUTED CONSTANT FILTER CIRCUIT MODULE

RELATED APPLICATION DATA

This application claims priority to Japanese Application No. P11-055590 filed Mar. 3, 1999, and is a divisional of U.S. application Ser. No. 09/514,382, filed Feb. 28, 2000 now U.S. Pat. No. 6,377,141, both of which are incorporated herein by reference to the extent permitted by law.

BACKGROUND OF THE INVENTION

1. Field of the Invention

The present invention relates to a filter device used mainly in a microwave or millimeter wave band and, more particularly, to a distributed constant filter in which various wiring patterns are formed as circuit devices, a method of manufacturing the distributed constant filter, and a distributed constant filter circuit module.

2. Description of the Related Art

In a cellular telephone system such as a portable telephone or car telephone, or a communication system such as a wireless LAN (Local Area Network) using high frequency radio waves in the microwave band or millimeter wave band as carriers, a filter device such as a low pass filter (LPF), high pass filter (HPF), or band pass filter (BPF) is usually designed not as a lumped parameter line or a concentrated constant circuit but as a distributed constant circuit (or a distributed parameter circuit). The lumped parameter line is a circuit in which the physical size of a device as a component of the circuit is sufficiently smaller than the wavelength of an electric signal and which uses chips such as an inductance L and a capacitor C as circuit devices. The distributed constant circuit is constructed by using microstrip lines which will be described hereinlater and uses various wiring patterns each having the length that is about the same as the wavelength of an electric signal as circuit devices.

FIG. 15 shows a plan view of a BPF having microstrip line patterns formed in one plane on a dielectric substrate. The BPF shown in the diagram has a structure such that a plurality of narrow microstrip lines 102(1) to 102(5) made of a conductor such as copper are disposed in parallel so as to be apart from each other at predetermined intervals on a dielectric substrate 101 made of a material such as ceramic. The neighboring microstrip lines are disposed so as to be staggered each other in the longitudinal direction in such a manner that a part of a length, which is about the quarter of a pass wavelength λ, of one of the neighboring microstrip lines overlaps with that of the neighboring microstrip line. The microstrip lines 102(1) to 102(5) can be simultaneously formed in a process of forming a wiring pattern on a wiring board performed by printing or lithography.

In the BPF of the configuration of using such microstrip lines, for example, an RF signal RF1 supplied from an end of the microstrip line 102(1) passes through the microstrip lines 102(1) to 102(4), during which high frequency components except for a component of the wavelength λ in the RF signal RF1 are eliminated. Only an RF signal RF2 of the wavelength of λ is outputted from an end of the microstrip line 102(5). When it is assumed that the wavelength of a radio wave in a space is λ0 and the effective dielectric constant of the substrate is εw, the pass wavelength λ is given by the following equation (1). By optimizing the pattern of the microstrip lines 102(1) to 102(4), therefore, RF signals in a desired frequency band can be selectively allowed to pass.

$$\lambda = \lambda 0/(\epsilon w)^{1/2} \quad (1)$$

In recent years, also in the uses of high frequencies, a demand of reducing the size of a device and a substrate has been becoming stronger. In the BPF of the configuration using the microstrip lines shown in FIG. 15, however, the length of the pattern of the microstrip line is almost determined by the pass wavelength. Consequently, the reduction in the pattern occupying area is naturally limited and it is difficult to reduce the size of the device and substrate.

For example, as shown in FIGS. 16 and 17, what is called a triplate structure filter in which a conductor pattern is not formed in the surface layer of the substrate but a pair of conductor patterns are formed in an inner layer of a substrate having ground conductive layers on both sides has been proposed. FIG. 16 is a perspective view of the triplate structure filter. FIG. 17 is a plan view of the filter. As shown in the diagrams, the filter comprises a first substrate 111*a* made of a dielectric, a pair of conductor patterns 115(1) and 115(2) formed on the first substrate, and a second substrate 111*b* made of a dielectric staked on the first substrate 111*a* so as to sandwich the conductor patterns 115(1) and 115(2). A stacked substrate 111 comprised of the first and second substrates 111*a* and 111*b* is covered with a ground conductive layer 117 connected to the ground except for a pair of side end face areas 113(1) and 113(2).

The conductor pattern 115(1) functions as an input side conductor pattern and has a form in which a relatively wide conductor pattern 115(1)*a* as a low impedance line (hereinbelow, also referred to as a low impedance pattern for short) and a relatively narrow conductor pattern 115(1)*b* as a high impedance line (hereinbelow, also simply referred to as a high impedance pattern for short) are cascade connected. On the other hand, the conductor pattern 115(2) functions as an output side conductor pattern and has a form in which a relatively wide conductor pattern 115(2)*a* and a relatively narrow conductor pattern 115(2)*b* are cascade connected. The conductor patterns 115(1) and 115(2) are disposed at a predetermined interval so as to be in parallel to each other in the longitudinal direction. The narrow conductor patterns 115(1)*b* and 115(2)*b* are respectively connected in their intermediate parts in the longitudinal direction to an input part pattern 116(1) to which the RF signal RF1 is supplied and an output part pattern 116(2) from which the RF signal RF2 filtered in a band is outputted. One end of each of the narrow conductor patterns 115(1)*b* and 115(2)*b* is connected to the ground conductive layer 117 covering one end face of the stacked substrate 111.

As illustrated in FIG. 18, the filter is equivalently expressed in a form in which a parallel resonance circuit PR1 comprising a capacitor C1 and an inductance L1 connected between the input part pattern 116(1) and the ground and a parallel resonance circuit PR2 comprising a capacitor C2 and an inductance L2 connected between the output part pattern 116(2) and the ground are capacitive coupled to each other via a capacitor C3.

In the filter, the RF components except for the wavelength λ of the RF signal RF1 supplied from the end of the input part pattern 116(1) are eliminated through the conductor patterns 115(1) and 115(2) functioning as the parallel resonance circuits PR1 and PR2. Only the RF signal RF2 of the wavelength λ is outputted from the end of the output part pattern 116(2). According to the filter of the triplate structure, the area occupied by the conductor patterns can be reduced more than the microstrip filter shown in FIG. 15, so that the miniaturization of the BPF can be realized.

When the triplate structure filter is allowed to function as an equivalent circuit shown in FIG. 18, a filter of a comline type in which a pair of lines (conductor patterns) each having a length of the quarter of the pass wavelength λ are capacitive coupled is usually employed. In the patterns shown in FIGS. 16 and 17, by cascade connecting the lines of different impedances, the line overall length La is made shorter than λ/4, thereby realizing the miniaturization. In the following description, a BPF of such a type will be called a shortened comline type distributed constant BPF.

As described above, the BPF using the microstrip lines shown in FIG. 15 can be formed by one operation as a part of a pattern of the surface layer of a substrate in a wiring process of forming a wiring pattern on the surface layer of a wiring board by printing or lithography. For instance, as shown in FIG. 19, line connection between the BPF comprising the microstrip lines 102(1) to 102(5) and circuit chips such as an MMIC (Microwave Monolithic IC) 124 and chip capacitors 123(1) to 123(4) can be performed on a surface of the substrate 101. FIG. 19 is a plan view showing the configuration of a substrate module having the BPF using microstrip lines on the surface. Patterns 120(1) to 120(4) are ground conductive patterns, patterns 121(1) and 121(2) are power supply pads, and patterns 122(1) and 122(2) are power supply lines.

When the triplate structure BPF shown in FIGS. 16 and 17 is used in order to reduce the size of the substrate, however, the pair of conductor patterns 115(1) and 115(2), the input part pattern 116(1), and the output part pattern 116(2) are formed in the inner layer of the substrate. For example, as shown in FIG. 20, a conductor pattern area 137 in the BPF in the inner layer of the substrate 101 and connection pads 135(1) and 135(2) of the wiring pattern in the surface layer have to be connected to each other by using vias 136(1) and 136(2), respectively. More specifically, the input part pattern 116(1) (FIGS. 16 and 17) and the connection pad 135(1) have to be connected to each other by the via 136(1) and the output part pattern 116(2) (FIGS. 16 and 17) and the connection pad 135(2) have to be connected to each other by the via 136(2).

FIG. 20 is a plan view showing the configuration of a substrate module constructed by using the triplate structure BPF. The area 137 shown by an alternate long and short dash line corresponds to an area in which the conductor patterns in the inner layer are formed (that is, the area in which the pair of conductor patterns 115(1) and 115(2), the input part pattern 116(1) and the output part pattern 116(2) are formed). In the diagram, patterns 130(1) to 130(3) are ground conductive patterns, patterns 131(1) and 131(2) are power supply pads, patterns 132(1) and 132(2) are power supply lines, and patterns 138(1) to 138(4) are signal wiring patterns. The power supply wiring and the signal wiring patterns are connected to circuit chips such as MMIC 134 and chip capacitors 133(1) to 133(4) mounted on the surface of the substrate.

When the patterns in the inner layer of the substrate and the wiring patterns in the surface layer are connected to each other by the vias, parasitic inductance components (high impedance) of the vias are applied to the input/output parts of the BPF and it causes a change in the desired filter characteristics such as the center frequency and insertion loss.

As described above, the conductor patterns in the inner layer in the shortened comline type triplate structure BPF shown in FIGS. 16 and 17 has a form in which the low impedance wide pattern 115(1)*a* and the high impedance narrow pattern 115(1)*b* are cascade connected in order to reduce the size. There is a case such that the difference between the pattern widths is about ten times or more. Consequently, there is a fear such that the junction part between the low and high impedance patterns is subjected to a great stress by repetition of such as the temperature change and the performance of the filter deteriorates.

SUMMARY OF THE INVENTION

The invention has been achieved in consideration of the problems. The object of the invention is to provide a distributed constant filter, a method of manufacturing the distributed constant filter, and a distributed constant filter circuit module, capable of being connected to another wiring pattern or the like while maintaining the small size and eliminating the problems.

According to the invention, there is provided a distributed constant filter comprising: a substrate made of a dielectric; an input side conductor pattern which is formed on the surface or inside of the substrate and to which an electromagnetic signal is supplied; and an output side conductor pattern which is formed on the surface or inside of the substrate so as to sandwich the dielectric with the input side conductor pattern and outputs an electromagnetic signal in a frequency band as a part of a frequency band of the electromagnetic signal supplied to the input side conductor pattern, wherein at least one of at least a part of the input side conductor pattern and at least a part of the output side conductor pattern is formed to extend in the thickness direction of the substrate.

According to the invention, there is provided a method of manufacturing a distributed constant filter, comprising: a step of forming an input side conductor pattern and an output side conductor pattern on the surface or inside of a substrate made of a dielectric so as to interpose the dielectric between the patterns, the input side conductor pattern being supplied with an electromagnetic signal, the output side conductor pattern outputting an electromagnetic signal in a frequency band as a part of a frequency band of the electromagnetic signal supplied to the input side conductor pattern, wherein the step of forming the input side conductor pattern and the output side conductor pattern includes at least of: a step of forming a at least a part of the input side conductor pattern so as to extend in the thickness direction; and a step of forming at least a part of the output side conductor pattern so as to extend in the thickness direction.

According to the invention, there is provided a distributed constant filter circuit module comprising: a substrate made of a dielectric; an input side conductor pattern which is formed on the surface or inside of the substrate and to which an electromagnetic signal is supplied; an output side conductor pattern which is formed on the surface or inside of the substrate so as to sandwich the dielectric with the input side conductor pattern and outputs an electromagnetic signal in a frequency band as a part of a frequency band of the electromagnetic signal supplied to the input side conductor pattern; and a circuit chip disposed on the surface of the substrate and connected to the input side conductor pattern or the output side conductor pattern, wherein at least one of at least a part of the input side conductor pattern and at least a part of the output side conductor pattern is formed so as to extend in the thickness direction of the substrate.

In the distributed constant filter of the invention, at least one of at least a part of the input side conductor pattern and at least a part of the output side conductor pattern is formed so as to extend in the thickness direction of the substrate. An electromagnetic signal is supplied to the input side conductor pattern and an electromagnetic signal in a frequency band as a part of a frequency band of the electromagnetic signal supplied to the input side conductor pattern is outputted from the output side conductor pattern formed so as to sandwich the dielectric with the input side conductor pattern.

In the distributed constant filter of the invention, at least one of the input side conductor pattern and the output side conductor pattern includes a first conductor part and a second conductor part having different impedances. In this case, it is preferable that the part formed so as to extend in the thickness direction of the substrate is either the first or second conductor part having a higher impedance. Further, in this case, the conductor part having a higher impedance serves as an interlayer connecting part for connecting one of the plurality of conductor layers to another layer of those. In this case, the following configuration is also possible. Among the plurality of conductor layers, the conductor layer formed on the surface of the substrate functions as a wiring pattern to which a circuit chip is connected and the conductor layer formed inside of the substrate functions as either the first or second conductor part having a lower impedance.

In the method of manufacturing the distributed constant filter of the invention, in the step of forming the input side conductor pattern and the output side conductor pattern, the conductor part which extends in the thickness direction of the substrate and serves as at least a part of the input side conductor pattern is formed and the conductor part which extends in the thickness direction of the substrate and serves as at least a part of the output side conductor pattern is formed.

In the method of manufacturing the distributed constant filter of the invention, the step of forming the input side conductor pattern and the output side conductor pattern includes: a step of selectively forming a pair of conductor patterns functioning as a part of the input side conductor pattern and a part of the output side conductor pattern at an interval on a surface of a first dielectric substrate, the surface being opposite to the other surface on which a first ground conductor pattern is formed; a step of stacking a second dielectric substrate on the surface of the first dielectric substrate and combining the substrates to thereby form a single combined substrate; a step of selectively forming a pair of wiring patterns made of a conductor at an interval on the surface of the second dielectric substrate in the combined substrate; a step of forming a pair of through holes in the combined substrate so that the through holes allow each of the pair of conductor patterns to communicate each of the pair of wiring patterns, respectively; and a step of forming a pair of conductor functioning as another part of the input side conductor pattern and another part of the output side conductor pattern in the pair of through holes, to thereby make a electrical connection between each of the pair of conductor patterns and each of the pair of wiring patterns.

In the method of manufacturing the distributed constant filter of the invention, the step of forming the input side conductor pattern and the output side conductor pattern may comprise: a step of forming a pair of first through holes in a first dielectric substrate; a step of selectively forming a pair of conductor patterns functioning as a part of the input side conductor pattern and a part of the output side conductor pattern on one of the surfaces of the first dielectric substrate and forming a pair of conductors functioning as another part of the input side conductor pattern and another part of the output side conductor pattern in the pair of first through holes; a step of stacking a second dielectric substrate having a pair of second through holes formed in correspondence with the pair of first through holes of the first dielectric substrate on the surface on which the pair of conductor patterns are formed of the first dielectric substrate and combining both of the substrates to thereby form a single combined substrate; and a step of selectively forming a pair of wiring patterns made of a conductor at an interval on the surface of the second dielectric substrate in the combined substrate and forming another pair of conductors functioning as another part of the input side conductor pattern and another part of the output side conductor pattern in the pair of second through holes of the second dielectric substrate to thereby make electrical connections between each of the pair of conductor patterns formed on the surface of the first dielectric substrate and each of the pair of wiring patterns.

Other and further objects, features and advantages of the invention will appear more fully from the following description.

DETAILED DESCRIPTION OF THE PREFERRED EMBODIMENTS

Embodiments of the invention will be described in detail hereinbelow reference to the drawings.

Figure 1:
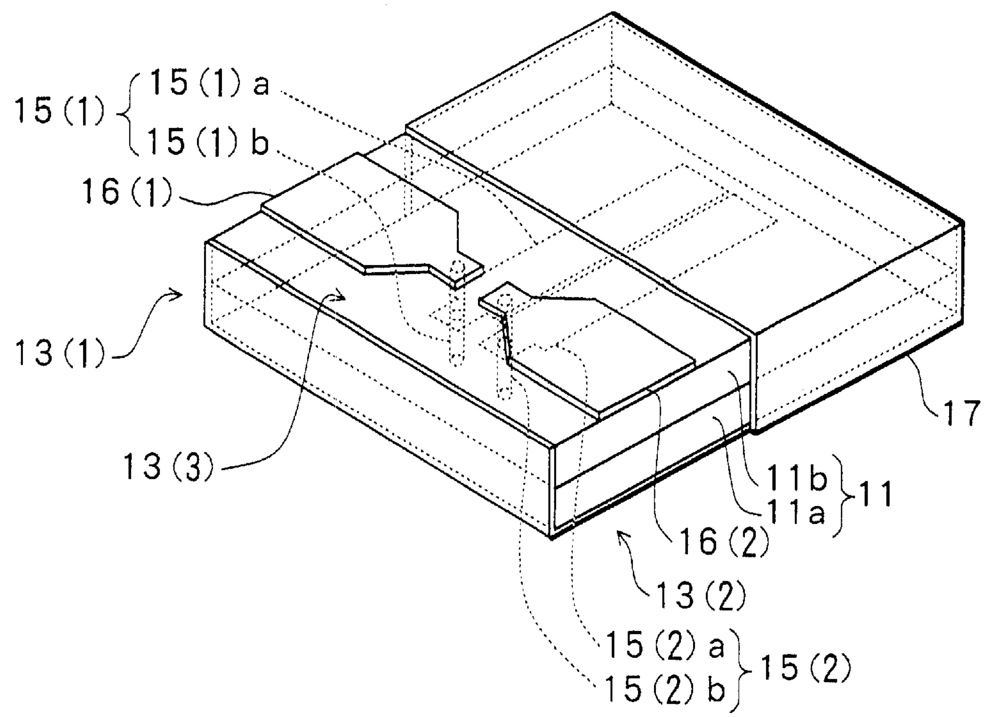
FIG. 1 is a perspective view showing the configuration of a distributed constant filter according to an embodiment of the invention.
Figure 2:
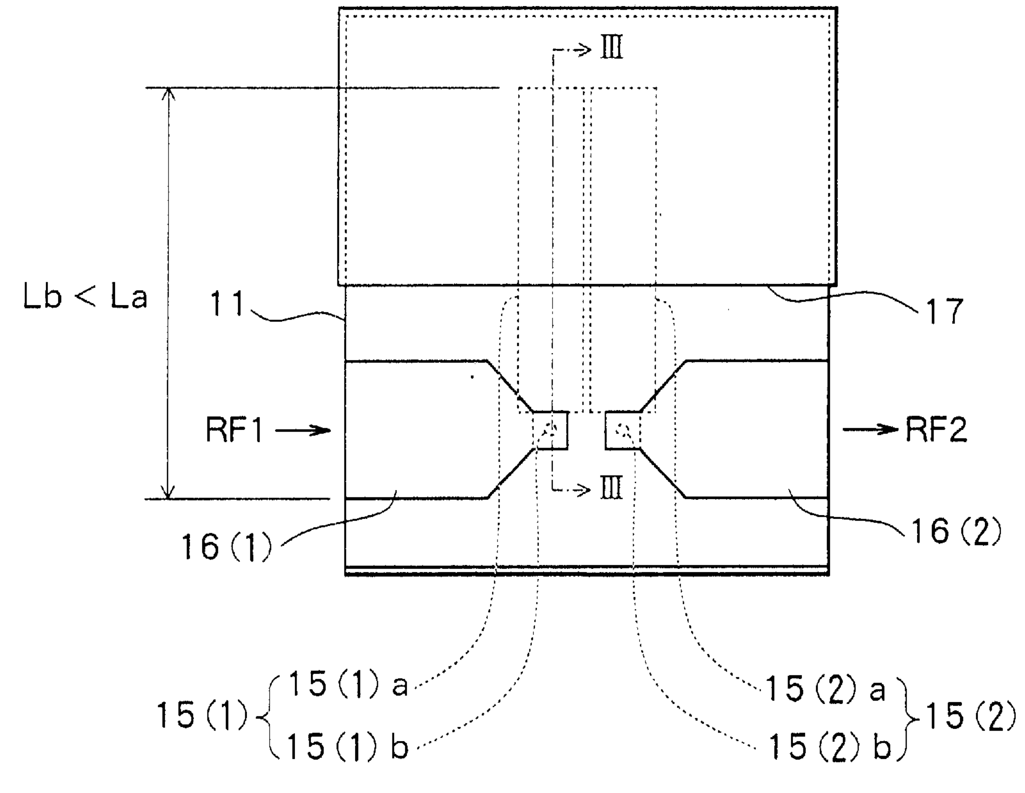
FIG. 2 is a plan view showing the configuration of the distributed constant filter.
Figure 3:
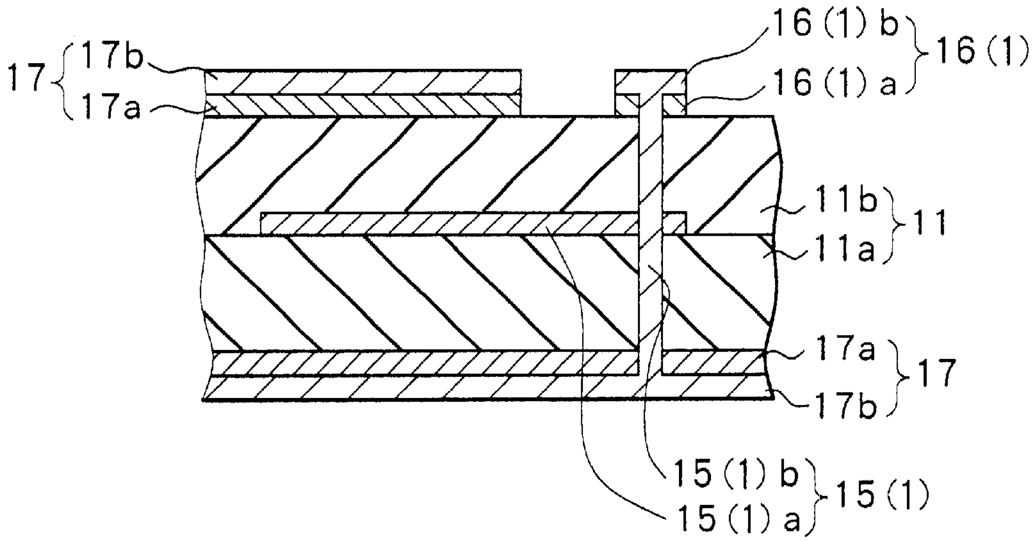
FIG. 3 is a cross section showing the configuration of the distributed constant filter.

FIGS. 1 to 3 show the configuration of a triplate structure band-pass filter as a distributed constant filter according to an embodiment of the invention. FIG. 1 is a perspective view, FIG. 2 is a plan view, and FIG. 3 is a cross section taken along line III—III of FIG. 2. As shown in the diagrams, the filter comprises a first substrate 11*a* made of a dielectric, a second substrate 11*b* made of a dielectric stacked on the first substrate 11*a,* and a pair of conductor patterns 15(1) and 15(2) formed in the stacked substrate 11 constructed by the first and second substrates 11*a* and 11*b.* The stacked substrate 11 except for a pair of side end face areas 13(1) and 13(2) and a upper surface area 13(3) is covered with a ground conductive layer 17 connected to the ground. The first and second substrates 11*a* and 11*b* are made of an organic material such as a polyolefin resin which is, for example, polytetrafluoroethylene (trade name; Teflon), polyimide, or glass epoxy. The first substrate 11*a* corresponds to an example of a "first dielectric substrate" in the invention, the second substrate 11*b* corresponds to an example of a "second dielectric substrate" in the invention, and the stacked substrate 11 corresponds to an example of a "combined substrate" in the invention.

The conductor pattern 15(1) functions as an input side conductor pattern and has a relatively wide low impedance pattern 15(1)*a* and a relatively narrow high impedance pattern 15(1)*b*. The conductor pattern 15(2) functions as an output side conductor pattern and has a relatively wide low impedance pattern 15(2)*a* and a relatively narrow high impedance pattern 15(2)*b*. The low impedance patterns 15(1)*a* and 15(2)*a* are disposed as an inner layer sandwiched by the first and second substrates 11*a* and 11*b* so as to be almost in parallel to each other in the longitudinal direction at a predetermined interval. The high impedance patterns 15(1)*b* and 15(2)*b* are formed so as to penetrate the stacked substrate 11 comprised of the first and second substrates 11*a* and 11*b* in the thickness direction. In the inner layer face, the high impedance patterns 15(1)*b* and 15(2)*b* cross the low impedance patterns 15(1)*a* and 15(2)*a* and are electrically connected to the low impedance patterns 15(1)*a* and 15(2)*a.*

Each of the high impedance patterns 15(1)*b* and 15(2)*b* has a relatively small capacity component and a relatively large resistance component. Each of the low impedance patterns 15(1)*a* and 15(2)*a* has a relatively large capacity component and a relatively small resistance component.

One end side (lower end side in FIGS. 1 and 3) of the high impedance pattern 15(1)*b* in the input side conductor pattern 15(1) is electrically connected to the ground conductive layer 17 on the back face side of the stacked substrate 11 (under face side in FIGS. 1 and 3) and the other end (the upper end side in FIGS. 1 and 3) is electrically connected to one end of an input part pattern 16(1) formed on the upper surface area 13(3). One end side (lower end side in FIGS. 1 and 3) of the high impedance pattern 15(2)*b* of the output side conductor pattern 15(2) is electrically connected to the ground conductive layer 17 on the back face side of the stacked substrate 11 (under face side in FIGS. 1 and 3) and the other end side (upper end side in FIGS. 1 and 3) is electrically connected to one end of an output part pattern 16(2) formed on the partial surface area 13(3). An RF signal RF1 is supplied to the input part pattern 16(1) and an RF signal RF2 filtered in a band is outputted from the output part pattern 16(2).

As described above, the high impedance patterns 15(1)*b* and 15(2)*b* function as high impedance lines of a shortened comline type distributed constant BPF and also have the function of electrically connecting the conductive pattern in the surface layer of the stacked substrate 11 and the conductive pattern in the inner layer.

In the embodiment, as shown in FIG. 3, the ground conductive layer 17 has a conductive underlayer 17*a* and a conductive cover layer 17*b* formed, for example, as a plating layer on the conductive underlayer 17*a.* Similarly, as shown in FIG. 3, the input part pattern 16(1) has a conductive underlayer 16(1)*a* and a conductive cover layer 16(1)*b* formed, for example, as a plating layer on the conductive underlayer 16(1)*a.* The output part pattern 16(2) has a similar stack structure. As will be described hereinlater, for example, the high impedance pattern 15(1)*b* can be formed as a plating layer obtained by allowing the conductive cover layers 17*b* and 16(1)*b* to further grow.

Figure 18:
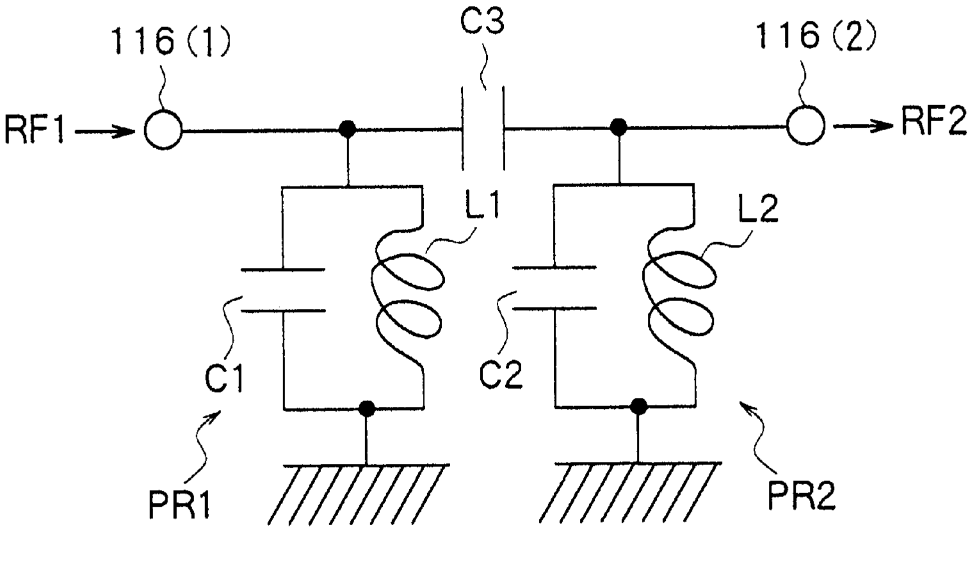
FIG. 18 is a circuit diagram of an equivalent circuit of the triplate structure band-pass filter.
Figure 19:
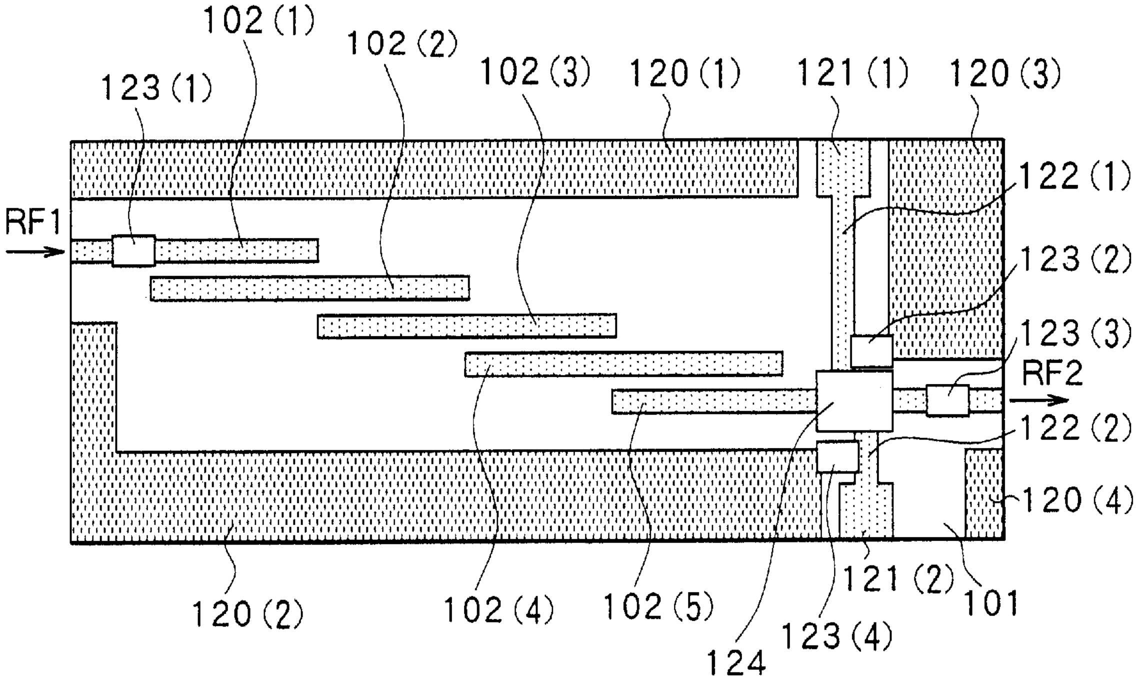
FIG. 19 is a plan view showing an example of a distributed constant filter circuit module having a band-pass filter using microstrip lines and a parts mounting face including wiring patterns of the related art.
Figure 20:
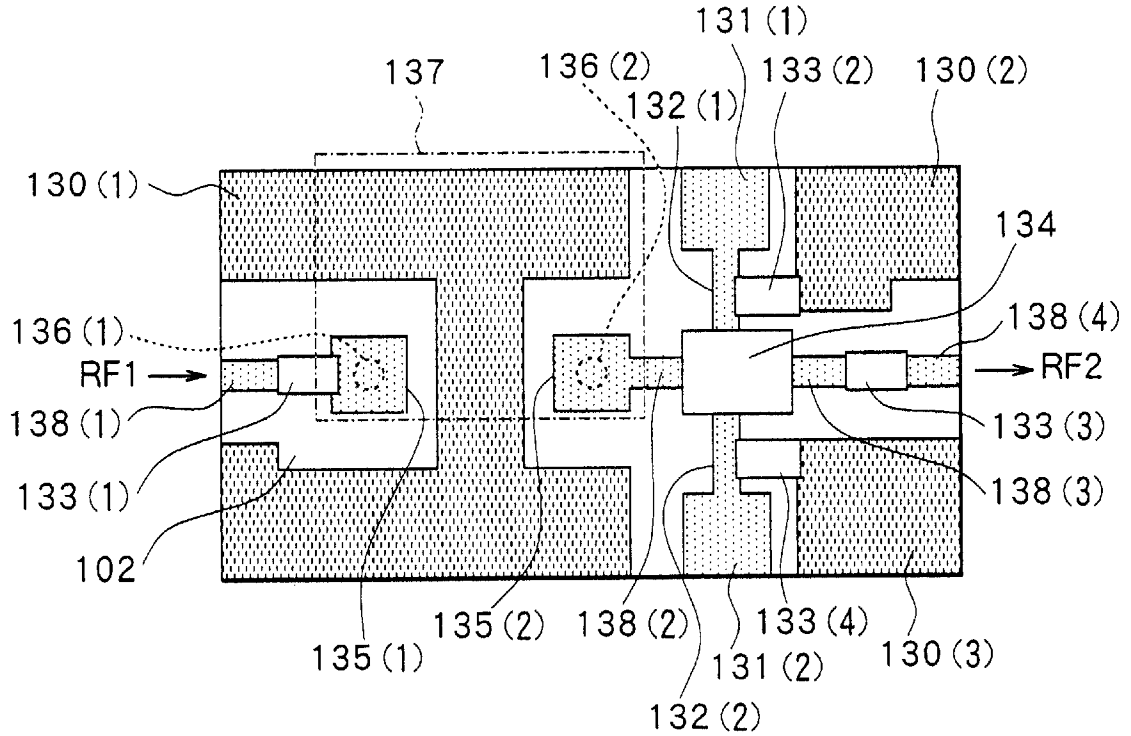
FIG. 20 is a plan view showing an example of a distributed constant filter circuit module having a triplate structure band-pass filter and a parts mounting face including wiring patterns of the related art.

The action of the distributed constant filter with the configuration as described above will now be explained. The filter functions equivalent to the circuit shown in FIG. 18. To be specific, in the filter, the RF signal RF1 supplied from the end of the input part pattern 16(1) passes through the conductor patterns 15(1) and 15(2), during which the high frequency components except for the wavelength λ are eliminated from the RF signal RF1 and only the RF signal RF2 of the wavelength λ is outputted from the end of the output part pattern 16(2).

Figure 16:
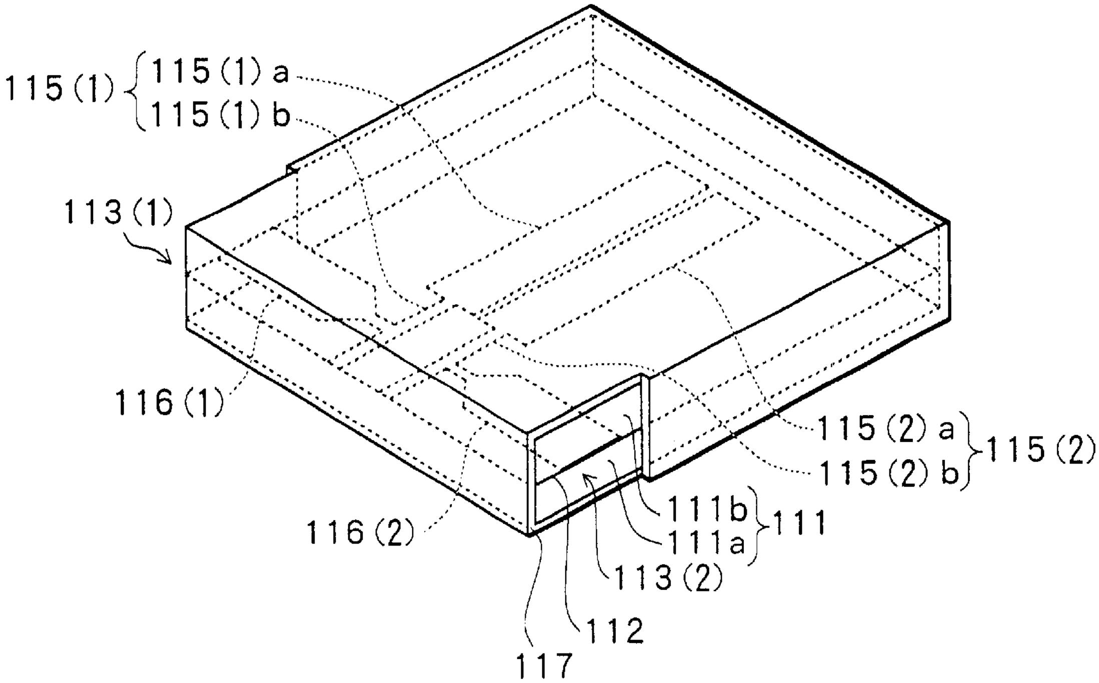
FIG. 16 is a perspective view showing the configuration of a triplate structure band-pass filter of a related art.
Figure 17:
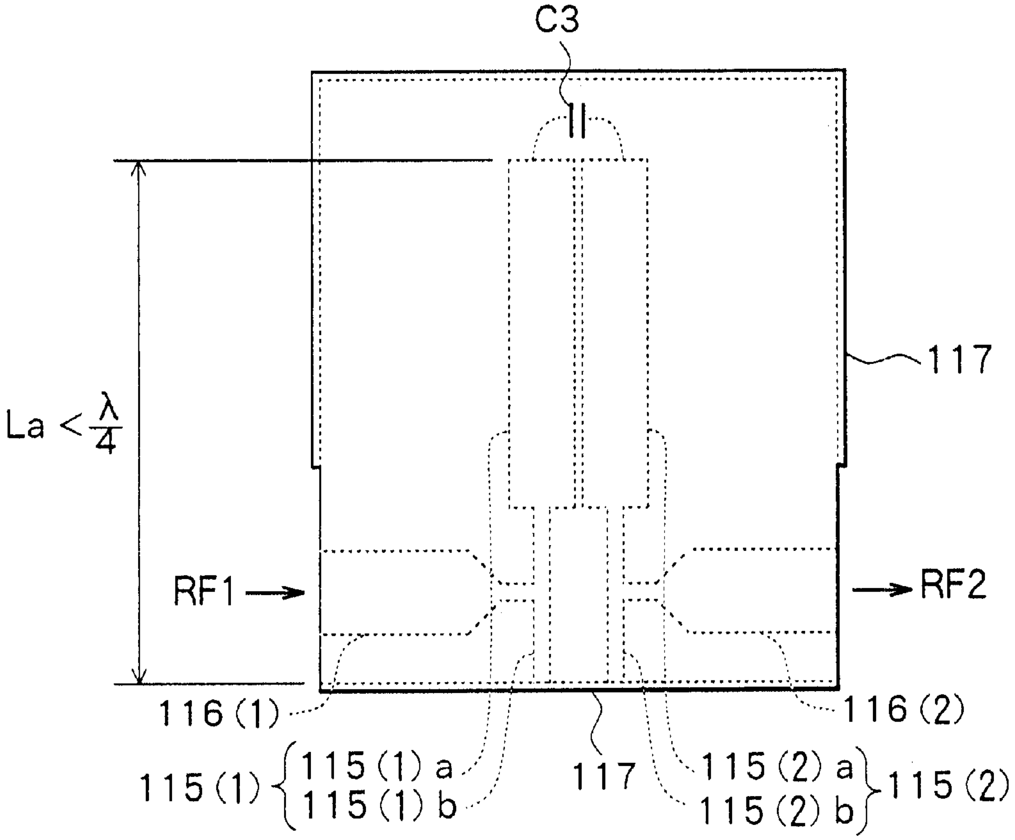
FIG. 17 is a plan view showing the configuration of a triplate structure band-pass filter of the related art.

As described above, in the triplicate filter of the embodiment, in place of the high impedance patterns 115(1)*b* and 115(2)*b* formed in the inner layer side in the related art (FIG. 16), the via-like conductor patterns extending in the thickness direction of the stacked substrate 11 are formed and allowed to function as high impedance lines. As shown in FIG. 2, therefore, in the filter of the embodiment, as long as the filtering characteristics are the same, the line overall length Lb of the conductor patterns 15(1) and 15(2) is shorter than the line overall length La (FIG. 17) in the related art. Consequently, the area occupied by the conductor patterns 15(1) and 15(2) can be reduced. As a result, the size of the BPF can be reduced.

In the embodiment, since the high impedance line as a narrow flat conductor pattern in the related art is not disposed, the possibility of a break in the connection part of the wide and narrow lines due to the temperature stress is reduced. In the embodiment, the high impedance patterns 15(1)*b* and 15(2)*b* are formed so as to penetrate and cross the low impedance patterns 15(1)*a* and 15(2)*a*, respectively, so that the cross part is not easily broken even when the temperature stress is applied.

Figure 4:
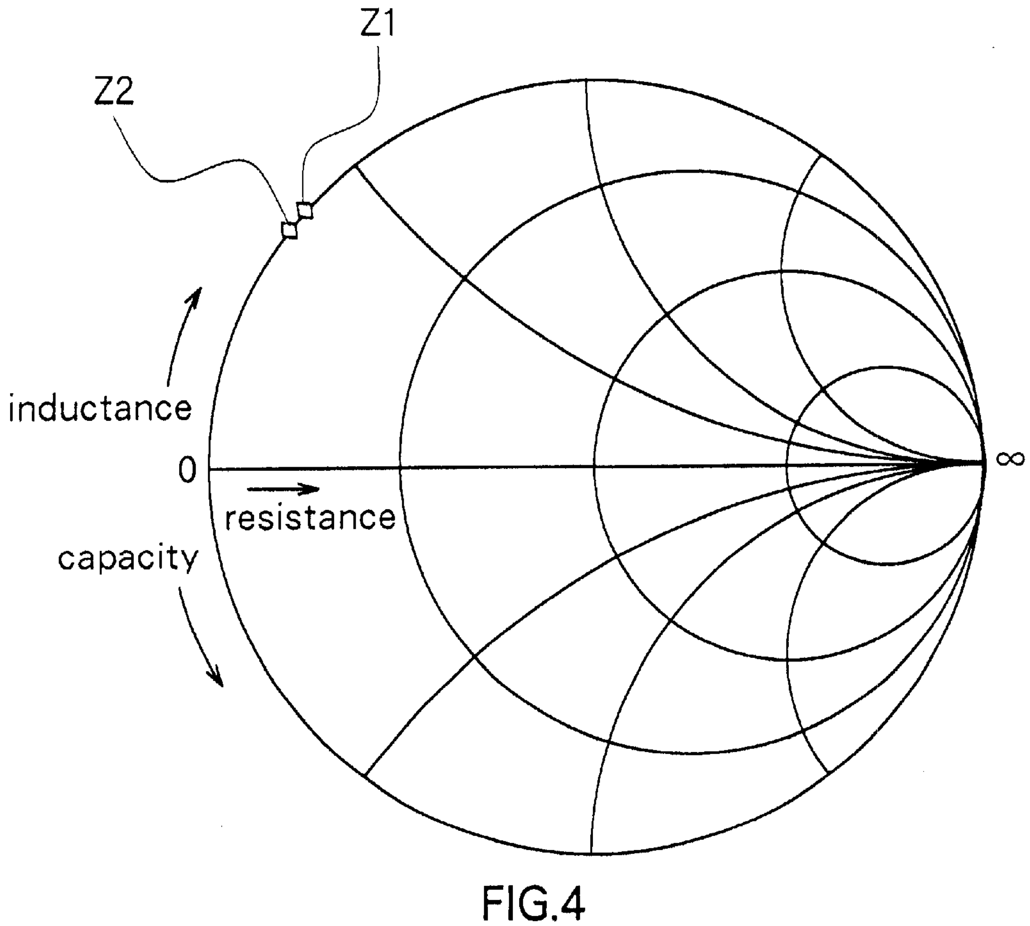
FIG. 4 is a characteristic diagram showing the result of simulation of an input impedance in accordance with the shape of a high impedance line.

FIG. 4 shows the result of an input impedance (S11) in a simulation of the S parameter in accordance with the shape of the high impedance line. The S parameter denotes a scattering parameter and shows the state of an internal circuit through the scattering of the power in the input/output parts. Especially, the parameter S11 corresponds to a reflection coefficient in an input, that is, the input impedance. In the diagram, an input impedance Z1 is obtained when the high impedance line is formed into a flat conductor pattern extending along the inner layer face of the substrate in a manner of the related art. An input impedance Z2 is obtained when the high impedance line is formed into a via-like conductor extending in the thickness direction of the substrate like the embodiment. The diagram is generally the so-called Smith chart. The lateral axis indicates the resistance component. The clockwise circle indicates the inductance component and the counterclockwise circle indicates the capacity component. The left end on each circumference indicates zero value of each of the inductance and capacity components. The right end on each circumference denotes an infinite value of each of the inductance, capacity and resistance components. The left end of the circumference of the largest circle corresponds to zero of the resistance component.

Figure 5A:
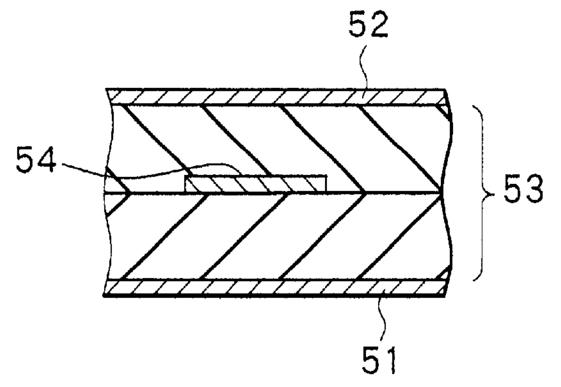
FIGS. 5A and 5B are cross sections of a substrate showing the shape of the high impedance line used for the simulation of FIG. 4.
Figure 5B:
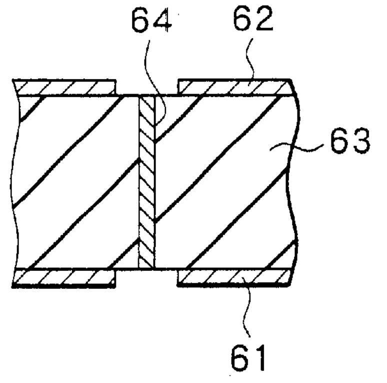

As shown in FIG. 5A, the input impedance Z1 is obtained when a flat conductor pattern having a length of 1.1 mm, a width of 0.3 mm, and a thickness of 18 μm is formed on the surface of an inter layer of a dielectric substrate 53 of 1.6 mm thick. On both sides of the dielectric substrate 53, ground conductive layers 51 and 52 are formed. On the other hand, as shown in FIG. 5B, the input impedance Z2 is obtained when a via-like conductor pattern 64 having the diameter of 0.2 mm is formed so as to penetrate a dielectric substrate 63 of 1.6 mm thick. On both sides of the dielectric substrate 63, ground conductive layers 61 and 62 are formed. In either case, the relative dielectric constant of each of the substrates 53 and 63 is set to 2.2 and the frequency used is set to 5.0 GHz.

As shown in FIG. 4, the input impedances Z1 and Z2 in the cases of using the shapes of the high impedance lines as shown in FIGS. 5A and 5B take on values close to each other. That is, there exists a pattern size in which the inductive behavior of both patterns are similar to each other. By optimizing the relative dielectric constant and the thickness of the dielectric substrate and the diameter of the via-like conductor, effects similar to those of the high impedance line in the related art can be obtained and a desired BPF can be formed.

Figure 6:
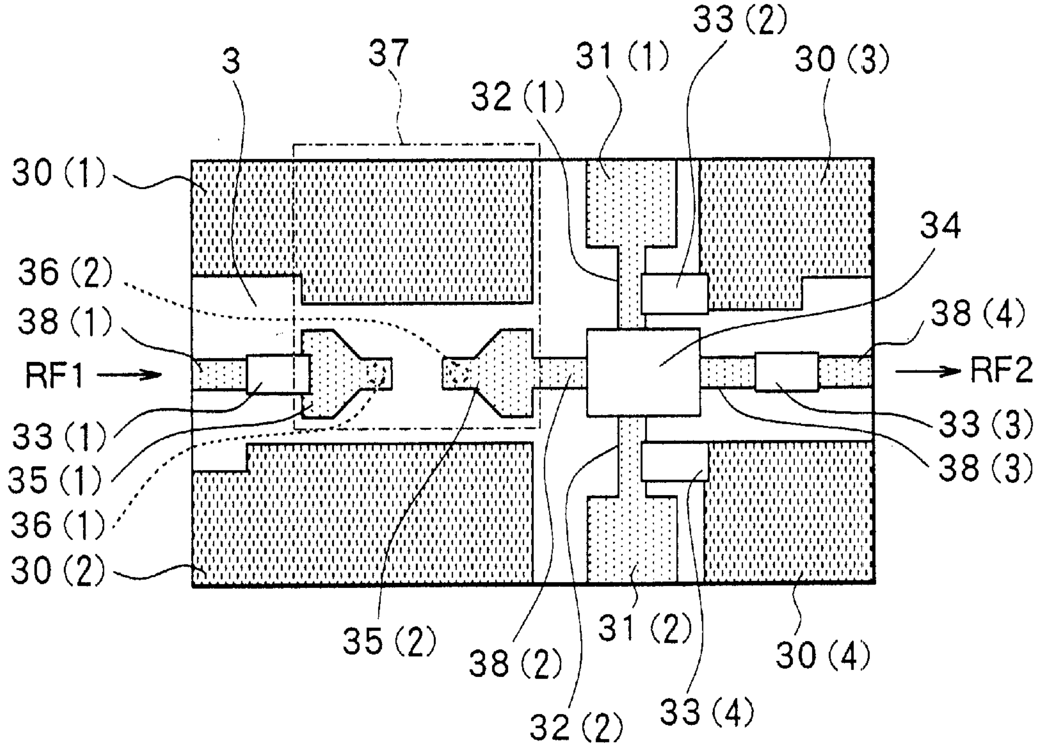
FIG. 6 is a plan view showing an example of a distributed constant filter circuit module having a distributed constant filter according to the embodiment of the invention, a wiring pattern, and a parts mounting face.

FIG. 6 is a plan view showing an example of the configuration of a distributed constant filter circuit module according to an embodiment of the invention. The distributed constant filter circuit module has therein a triplate structure BPF according to the embodiment and has a wiring pattern and circuit chips on the surface. In the diagram, an area 37 shown by an alternate long and short dash line corresponds to an area in which the triplate structure BPF shown in FIG. 1 is formed. Patterns 35(1) and 35(2) correspond to the input part pattern 16(1) and the output part pattern 16(2) in FIG. 1, respectively. Via-like conductive patterns 36(1) and 36(2) correspond to the high impedance patterns 15(1)*b* and 15(2)*b* in FIG. 1, respectively. Patterns 30(1) to 30(4) are ground conductive patterns, patterns 31(1) and 31(2) are power supply pads, patterns 32(1) and 32(2) are power supply lines, and patterns 38(1) to 38(4) are signal wiring patterns. The power supply lines and the signal wiring patterns are connected to the circuit chips such as an MMIC 34 and chip capacitors 33(1) to 33(4) mounted on the surface of the substrate.

As shown in the diagram, the via-like conductive patterns 36(1) as the high impedance pattern serves as a part of the conductor pattern 15(1) in FIG. 1 and the via-like conductive pattern 36(2) as the high impedance pattern serves as a part of the conductor pattern 15(2) in FIG. 1. The via-like conductive patterns 36(1), 36(2) also play the role of connecting the inner layer and the surface layer of the substrate 3. That is, according to the embodiment, both of the functions of the role of the high impedance lines and the role of connecting the inner layer and the surface layer are given to the via-like conductive patterns 36(1) and 36(2) extending in the thickness direction of the substrate 3, thereby eliminating the high impedance lines extending cascade to the low impedance lines in the related art. There is, consequently, no inconvenience such that the filter characteristic itself changes due to addition of the via for connecting the inner layer and the surface layer in the BPF of the related art. That is, the substrate module of a small area including the filter device can be realized without changing the filter characteristic, obviously not only in the case where the BPF is used as a triplate structure filter device as shown in FIG. 1 but also in the case where the BPF is mounted on a circuit implementation board as shown in FIG. 6.

A method of manufacturing the distributed constant filter having a configuration shown in FIGS. 1 to 3 will now be described.

FIGS. 7A, 7B to FIGS. 10A, 10B indicate cross sections in main manufacturing steps of the distributed constant filter shown in FIGS. 1 to 3. FIGS. 7A to 10A show plan views in the steps and FIGS. 7B to 10B show cross sections taken along lines VIIB—VIIB, VIIIB—VIIIB, IXB—IXB, and XB—XB in FIGS. 7A to 10A, respectively.

Figure 7A:
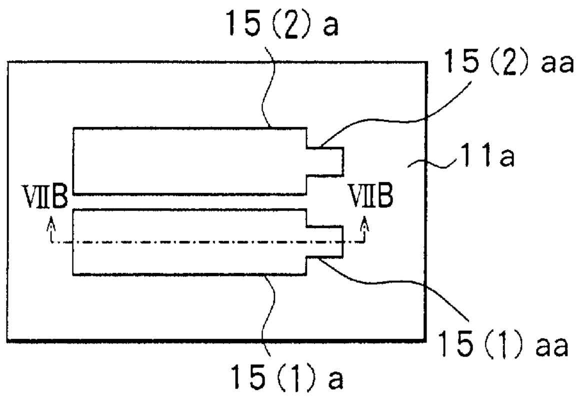
FIGS. 7A and 7B are a plan view and a cross section showing a step of a method of manufacturing a distributed constant filter according to the embodiment of the invention.
Figure 7B:
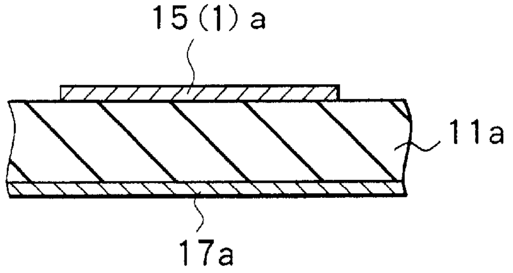

In the manufacturing method, first, as shown in FIGS. 7A and 7B, the low impedance patterns 15(1)*a* and 15(2)*a* made of a conductor (for example, a metal such as copper) are formed on one of the faces of the first substrate 11*a* made of a dielectric material (an organic material such as a polyolefin resin which is, for example, polytetrafluoroethylene, polyimide, or glass epoxy). The conductor patterns 15(1)*a* and 15(2)*a* partly have lands 15(1)*aa* and 15(2)*aa* for via connection, respectively. The conductor patterns 15(1)*a* and 15(2)*a* are formed by an ordinary method such as adhesion of metal foil, photolithography, or selective etching. On the other face of the first substrate 11*a,* the conductive underlayer 17*a* is formed.

Figure 8A:
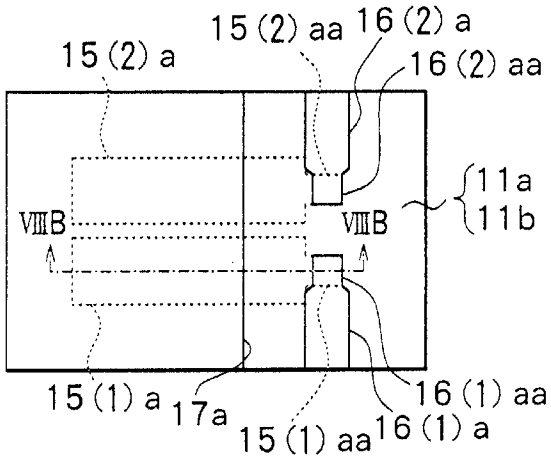
FIGS. 8A and 8B are a plan view and a cross section showing a step subsequent to FIGS. 7A and 7B.

As shown in FIG. 8A, on one of the faces of the second substrate 11*b* made of a dielectric material similar to that of the first substrate 11*a,* the conductive underlayers 16(1)*a* and 16(2)*a* as underlayers of the input part pattern 16(1) and the output part pattern 16(2) are formed and the conductive underlayer 17*a* as an underlayer of the ground conductive layer 17 is formed so as to cover most of the face. The patterns are formed in steps similar to those of formation of the conductor patterns 15(1)*a* and 15(2)*a.* The conductive underlayers 16(1)*a* and 16(2)*a* are formed in positions so that the lands 16(1)*aa* and 16(2)*aa* for via connection as parts of them correspond to the lands 15(1)*aa* and 15(2)*aa* for via connection of the conductor patterns 15(1)*a* and 15(2)*a,* respectively.

Figure 8B:
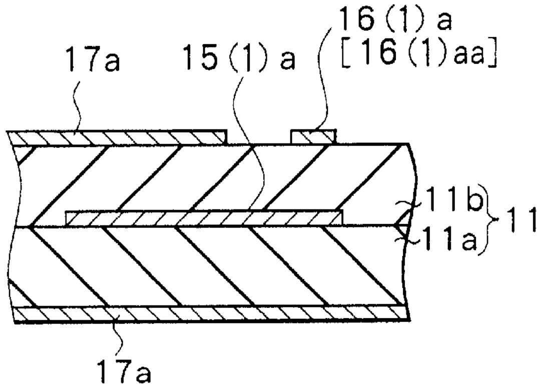

As shown in FIGS. 8A and 8B, the second substrate 11*b* is stacked on the first substrate 11*a,* thereby obtaining the stacked substrate 11. The face on which the conductor patterns 15(1)*a* and 15(2)*a* are formed of the first substrate 11*a* is in contact with the surface opposite to the surface on which the conductive underlayers 16(1)*a* and 16(2)*a* are formed of the second substrate 11*b*. The position of the land 16(1)*aa* for via connection of the conductive underlayer 16(1)*a* on the surface is made to coincide with the position of the land 15(1)*aa* for via connection of the conductor pattern 15(1)*a* of the inner layer. The position of the land 16(2)*aa* for via connection of the conductive underlayer 16(2)*a* on the surface of the substrate is made to correspond to the position of the land 15(2)*aa* for via connection of the conductive pattern 15(2)*a* of the inner layer.

Figure 9A:
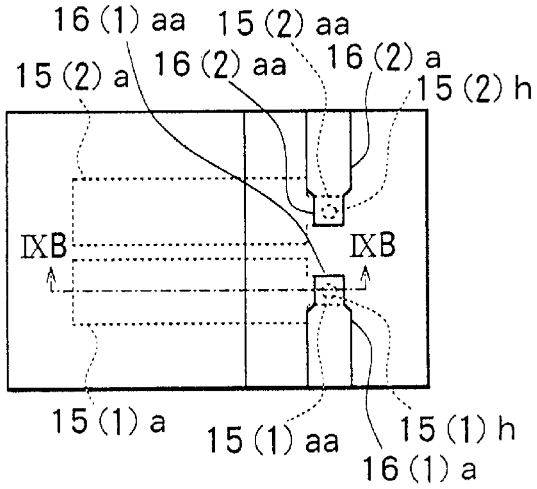
FIGS. 9A and 9B are a plan view and a cross section showing a step subsequent to FIGS. 8A and 8B.
Figure 9B:
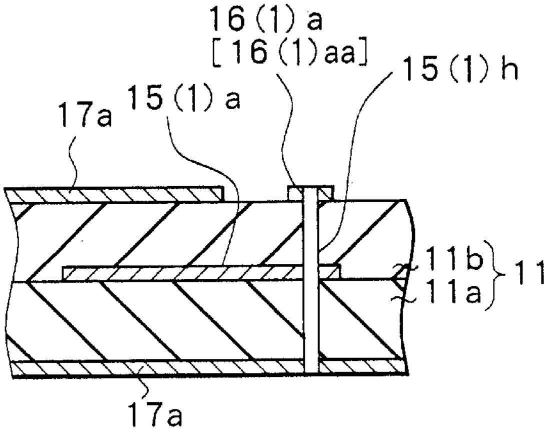

As shown in FIGS. 9A and 9B, a via hole 15(1)*h* penetrating from the land 16(1)*aa* for via connection of the conductive underlayer 16(1)*a* to the ground conductive layer 17*a* via the second substrate 11*b,* the land 15(1)*aa* for via connection in the inner layer, and the first substrate 11*a* is formed. Similarly, a via hole 15(2)*h* penetrating from the land 16(2)*aa* for via connection of the conductive underlayer 16(2)*a* to the ground conductive layer 17*a* via the second substrate 11*b,* the land 15(2)*aa* for via connection in the inner layer, and the first substrate 11*a* is formed. The via holes 15(1)*h* and 15(2)*h* are formed by, for example, drilling, laser machining, or the like.

Figure 10A:
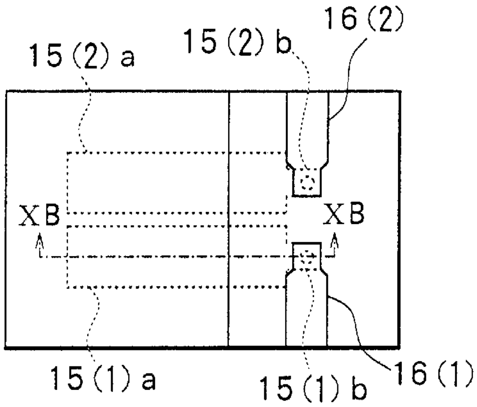
FIGS. 10A and 10B are a plan view and a cross section showing a step subsequent to FIGS. 9A and 9B.
Figure 10B:
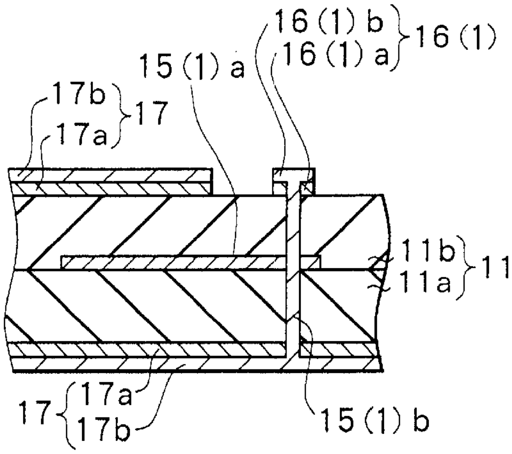

As shown in FIGS. 10A and 10B, the conductive underlayers 17*a,* 16(1)*a,* and 16(2)*a* are subjected to a plating process as the underlayer. On the conductive underlayers, conductive cover layers 17*b,* 16(1)*b* and 16(2)*b* which are, for example, copper plating layers are formed, respectively. Preferably, the copper plating layer has a three-layer structure of, for example, copper (Cu)-nickel (Ni)-gold (Au). In such a manner, the ground conductive layer 17 comprised of the conductive underlayer 17*a* and the conductive cover layer 17*b,* the input part pattern 16(1) comprised of the conductive underlayer 16(1)*a* and the conductive cover layer 16(1)*b,* and the output part pattern 16(2) comprised of the conductive underlayer 16(2)*a* and the conductive cover layer 16(2)*b* are formed. The plating layer grown from the conductive underlayers 16(1)*a* and 16(2)*a* extends from one end side (upper end side in the diagram) of each of the via holes 15(1)*h* and 15(2)*h* to the inside. Similarly, the plating layer grown from the ground conductive layer 17*a* extends from the other end side (lower end side in the diagram) of each of the via holes 15(1)*h* and 15(2)*h* to the inside. As a result, the via holes 15(1)*h* and 15(2)*h* are filled with the high impedance patterns 15(1)*b* and 15(2)*b,* respectively. Consequently, the input part pattern 16(1) in the surface layer, the low impedance pattern 15(1)*a* in the inner layer, and the ground conductive layer 17 on the back side are electrically connected to each other via the high impedance pattern 15(1)*b.* The output part pattern 16(2) in the surface layer, the low impedance pattern 15(2)*a* in the inner layer, and the ground conductive layer 17 on the back side are electrically connected to each other via the high impedance pattern 15(2)*b.* The input part pattern 16(1) and the output part pattern 16(2) correspond to an example of "a pair of wiring patterns" in the invention and the ground conductive layer 17 corresponds to an example of a "first ground conductive pattern and a second ground conductive pattern" in the invention.

In such a manner, the BPF shown in FIG. 1 is completed. Although omitted in FIGS. 7A, 7B to FIGS. 10A, 10B, the ground conductive layer 17 is formed also on the side faces of the stacked substrate 11 in practice.

According to the method of manufacturing the distributed constant filter of the embodiment as described above, the triplate structure filter comprising the low impedance patterns 15(1)*a* and 15(2)*a* disposed in the inner layer of the substrate, the wiring patterns (such as the input part pattern 16(1) and the output part pattern 16(2)) disposed in the surface layer of the substrate, and the high impedance patterns 15(1)*b* and 15(2)*b* connecting the conductor patterns 15(1)*a* and 15(2)*a* in the inner layer and the wiring patterns in the surface layer can be formed by relatively simple processes by using the substrate made of an organic material. In particular, in the manufacturing method, after the first and second substrates 11*a* and 11*b* are stacked, the via holes 15(1)*h* and 15(2)*h* are formed so as to penetrate both of the substrates. Consequently, there is no fear such that the position of the via hole in the first substrate 11*a* is deviated from that of the via hole in the second substrate 11*b.*

Second Embodiment

A method of manufacturing a distributed constant filter according to another embodiment of the invention will now be described. Since the structure of the distributed constant filter formed by the manufacturing method according to the second embodiment is almost similar to that shown in the foregoing embodiment, the description is omitted here.

FIGS. 11A, 11B to 13A, 13B show main manufacturing steps in the method of manufacturing the distributed constant filter according to the second embodiment. In the diagrams, the same components as those shown in FIGS. 7A, 7B to 10A, 10B are designated by the same reference numerals. In the manufacturing method, simultaneously baked ceramic is used for the first and second substrates 11*a* and 11*b.* The simultaneously baked ceramic is formed by stacking layers of a soft ceramic material called a green sheet made of alumina (Al2O3), glass ceramic, or the like which have not been baked and by baking the stacked layers in a lump.

Figure 11A:
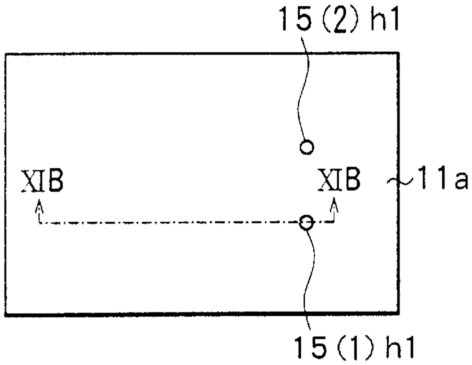
FIGS. 11A and 11B are a plan view and a cross section showing a step of a method of manufacturing a distributed constant filter according to another embodiment of the invention.
Figure 11B:
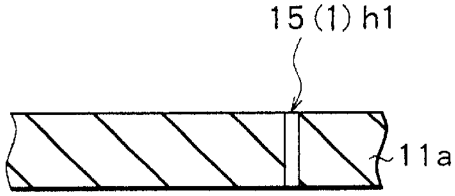

As shown in FIGS. 11A and 11B, a pair of via holes 15(1)*h*1 and 15(2)*h*1 are opened in the first substrate 11*a* as a green sheet by punching, laser method, or the like. The via holes 15(1)*h*1 and 15(2)*h*1 correspond to an example of "a pair of first through holes" in the invention.

Figure 12A:
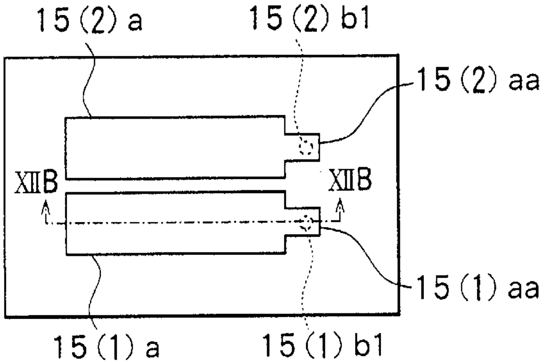
FIGS. 12A and 12B are a plan view and a cross section showing a step subsequent to FIGS. 11A and 11B.
Figure 12B:
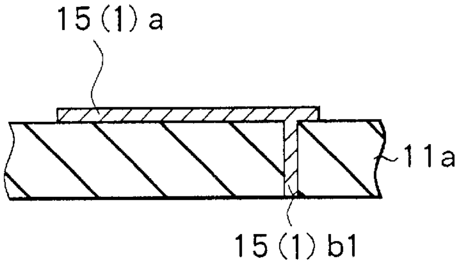

As shown in FIGS. 12A and 12B, a pair of conductor patterns 15(1)*a* and 15(2)*a* as low impedance lines made of a conductor (for example, a metal such as copper) are formed on the first substrate 11*a* and via-like conductor patterns 15(1)*b*1 and 15(2)*b*1 each serving as a part of the high impedance line are formed by filling the via holes 15(1)*h*1 and 15(2)*h*1 with a conductor. The conductor pattern 15(1)*a* partly has a land 15(1)*aa* for via connection and the conductor pattern 15(2)*a* partly has a land 15(2)*aa* for via connection. The conductor patterns 15(1)*a* and 15(2)*a* and the conductor patterns 15(1)*b*1 and 15(2)*b*1 are formed by, for example, printing. The conductor patterns 15(1)*b*1 and 15(2)*b*1 correspond to an example of "a pair of conductor" in the invention.

Figure 13A:
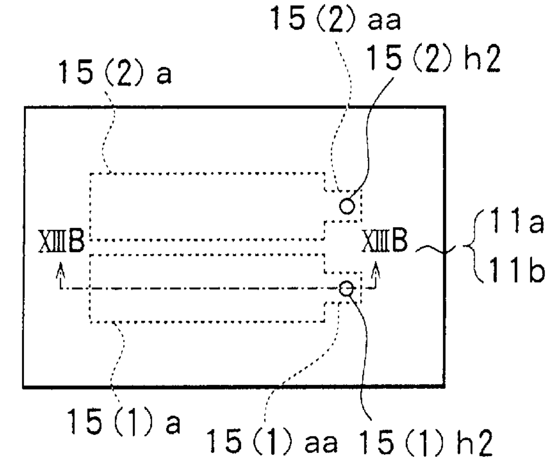
FIGS. 13A and 13B are a plan view and a cross section showing a step subsequent to FIGS. 12A and 12B.
Figure 13B:
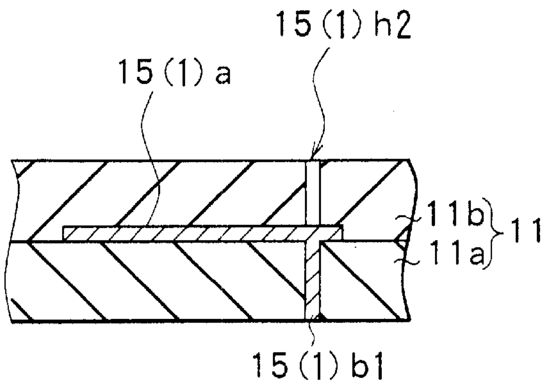

As shown in FIGS. 13A and 13B, in a manner similar to the case of the first substrate 11*a,* a pair of via holes 15(1)*h*2 and 15(2)*h*2 are formed in the second substrate 11*b* as a green sheet and the second substrate 11*b* is stacked on the first substrate 11*a,* thereby obtaining the stacked substrate 11. At this time, the positioning is performed so that the positions of the via holes 15(1)*h*2 and 15(2)*h*2 accurately coincide with the positions of the via-like conductor patterns 15(1)*b*1 and 15(2)*b*1, respectively. The via holes 15(1)*h*2 and 15(2)*h*2 correspond to an example of "a pair of second through holes" in the invention.

Figure 14A:
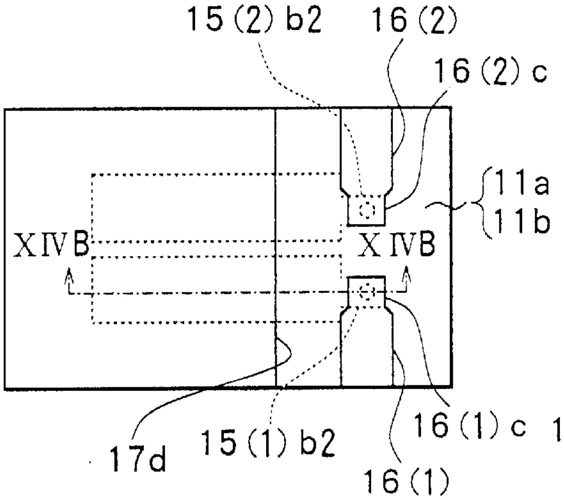
FIGS. 14A and 14B are a plan view and a cross section showing a step subsequent to FIGS. 13A and 13B.
Figure 14B:
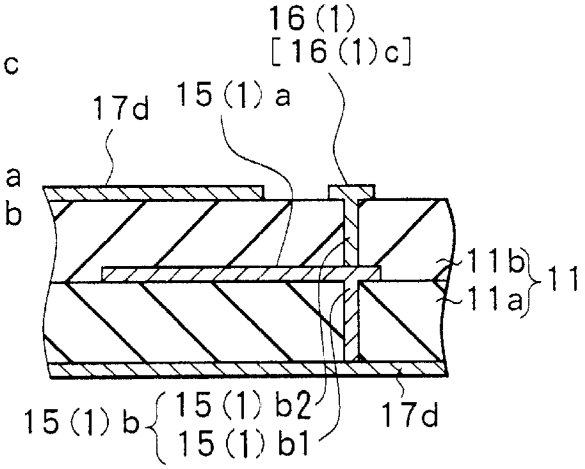
Figure 15:
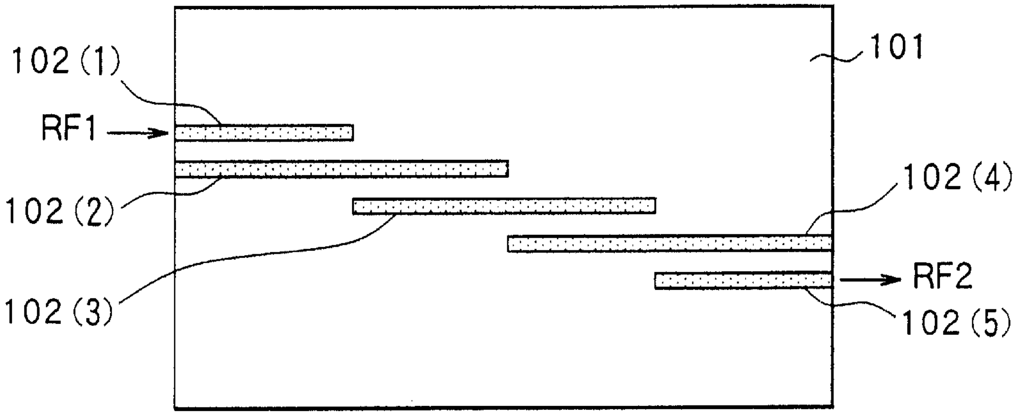
FIG. 15 is a plan view showing the configuration of a band-pass filter using microstrip lines of a related art.

As shown in FIGS. 14A and 14B, the input part pattern 16(1), the output part pattern 16(2), and the ground conductive layer 17*d* occupying most of the surface of the second substrate 11*b* are formed by printing on the surface of the second substrate 11*b,* and the via holes 15(1)*h*2 and 15(2)*h*2 are filled with a conductor, thereby forming the conductor patterns 15(1)*b*2 and 15(2)*b*2 serving as another parts of the high impedance lines. In such a manner, the conductor pattern 15(1)*b* comprised of the conductor patterns 15(1)*b*1 and 15(1)*b*2 and the conductor pattern 15(2)*b* comprised of the conductor patterns 15(2)*b*1 and 15(2)*b*2 are formed as high impedance lines. The conductor patterns 15(1)*b*2 and

15(2)*b*2 correspond to an example of "another pair of conductor" in the invention and the ground conductive layer 17*d* corresponds to an example of a "third ground conductive pattern" in the invention.

Similarly, as shown in FIGS. 14A and 14B, a ground conductive layer 17*d* (corresponding to the ground conductive layer 17 in FIG. 1) is formed on the back side of the first substrate 11*a* and the high impedance patterns 15(1)*b* and 15(2)*b* and the ground conductive layer 17*d* are electrically connected to each other. Consequently, the input part pattern 16(1) in the surface layer, the low impedance pattern 15(1)*a* in the inner layer, and the ground conductive layer 17*d* on the back side are electrically connected to each other via the high impedance pattern 15(1)*b*. The output part pattern 16(2) in the surface layer, the low impedance pattern 15(2)*a* in the inner layer, and the ground conductive layer 17*d* on the back side are electrically connected to each other via the high impedance pattern 15(2)*b*.

Finally, the whole stacked substrate 11 is simultaneously baked and the BPF shown in FIG. 1 is completed. The stacked substrate 11 is baked under the conditions that, for example, in the case of a green sheet made of alumina, the baking temperature is 1300 to 1400° C. and the baking time is one hour. In the case of a green sheet made of glass ceramic, the stacked substrate 11 is baked under the conditions that the baking temperature is 850 to 900° C. and the baking time is one hour. Although not shown in FIGS. 11 to 14, in practice, the ground conductive layer 17*d* is formed also on the side faces of the stacked substrate 11.

As described above, according to the method of manufacturing the distributed constant filter of the embodiment, the triplate structure filter comprising the low impedance patterns 15(1)*a* and 15(2)*a* disposed in the inner layer of the substrate, the wiring patterns (the input part pattern 16(1) and the output part pattern 16(2)) disposed in the surface layer of the substrate, and the high impedance patterns 15(1)*b* and 15(2)*b* for connecting the conductor patterns 15(1)*a* and 15(2)*a* in the inner layer and the wiring pattern in the surface layer can be formed by relatively simple processes by using an inorganic material substrate such as simultaneously baked ceramic. In particular, according to the manufacturing method, the via holes are formed in the first and second substrates 11*a* and 11*b* before stacking the substrates. Consequently, each via hole before stacking does not have to be deep and can be accordingly formed easier.

Although the invention has been described by some embodiments, the invention is not limited to the embodiments but can be variously modified. For example, in the embodiments, the low impedance patterns 15(1)*a* and 15(2)*a* are formed in the inner layer. The low impedance patterns 15(1)*a* and 15(2)*a* do not have to be formed in the inner layer but can be formed on one of the surfaces of the substrate. In this case, the wiring pattern is formed on the other surface of the substrate and the patterns on both sides are connected by using the via-like high impedance patterns.

Although the two substrates are stacked to form one combined substrate in the embodiments, three or more substrates can be also stacked. In this case, the via-like high impedance pattern can be made further longer without increasing the occupied area.

In the foregoing embodiments, the wide low impedance patterns are formed in the inner layer of the substrate so as to be along the substrate face and the high impedance patterns of the small diameter are formed in the thickness direction of the substrate. On the contrary, it is possible to form narrow high impedance patterns in the inner layer of the substrate so as to be along the substrate face and to form low impedance patterns having a large diameter in the thickness direction of the substrate.

Although the shortened comline type distributed constant BPF in which each of the pair of conductor patterns includes the high impedance part and the low impedance part has been described as an example in the embodiments, the invention can be also applied to a normal comline type distributed constant BPF having a configuration such that each of a pair of conductor patterns has an uniform impedance. In this case, a part of the conductor pattern having the uniform impedance is formed along the substrate face and the rest is formed so as to extend in the thickness direction of the substrate.

Although the bandpass filter has been described as an example of the distributed constant filter in the embodiments, the invention can be similarly applied to a low pass filter and a high pass filter.

As described above, according to the distributed constant filter, the method of manufacturing the distributed constant filter, or the distributed constant filter circuit module of the invention, the input side conductor pattern which is formed on the surface or inside of the substrate made of a dielectric and to which an electromagnetic signal is supplied and the output side conductor pattern which is formed on the surface or inside of the substrate and outputs an electromagnetic signal in a frequency band as a part of a frequency band of the electromagnetic signal supplied to the input side conductor pattern are formed so as to interpose a dielectric between the patterns and at least one of at least a part of the input side conductor pattern and at least a part of the output side conductor pattern is formed so as to extend in the thickness direction of the substrate. Consequently, the area occupied by the filter is reduced.

Particularly, according to the distributed constant filter of one aspect of the invention, at least one of the input side conductor pattern and the output side conductor pattern is comprised of a first conductor part and a second conductor part having different impedances, and the part formed so as to extend in the thickness direction of the substrate is either the first or second conductor part having a higher impedance. Therefore, the high impedance part, in the related art, formed in the same layer as the low impedance part can be eliminated. Consequently, it is possible to prevent that the junction part (boundary part) between the narrow conductor part and the wide conductor part both of which extend in a plane as in the related art is subjected to a great stress by repetition of the temperature change and that the performance of the filter deteriorates.

According to the distributed constant filter of another aspect of the invention, the conductor part having a higher impedance serves as an interlayer connecting part for connecting a plurality of different conductor layers formed on the surface and inside of the substrate. Consequently, the plurality of conductor layers formed as layers at different levels such as a conductor pattern formed in an inner layer and a wiring pattern formed in an external layer can be connected to each other without causing a change in the filter characteristics.

According to the method of manufacturing the distributed constant filter of another aspect of the invention, after stacking the first and second dielectric substrates, a pair of through holes are formed so as to penetrate both of the substrates. Thus, there is no fear that the position of the hole in the first dielectric substrate is deviated from the position of the hole in the second dielectric substrate.

According to the method of manufacturing the distributed constant filter of another aspect of the invention, before stacking the first and second dielectric substrates, a through hole is opened in each of the substrates. Thus, the through holes do not have to be so deep and the formation of the through holes is facilitated.

Obviously many modifications and variations of the present invention are possible in the light of the above teachings. It is therefore to be understood that within the scope of the appended claims the invention may be practiced otherwise than as specifically described.

What is claimed is:

1. A method of manufacturing a distributed constant filter, comprising:

a step of forming an input side conductor pattern and an output side conductor pattern on the surface or inside of a substrate made of a dielectric so as to interpose the dielectric between the patterns, the input side conductor pattern being supplied with an electromagnetic signal, the output side conductor pattern outputting an electromagnetic signal in a frequency band as a part of a frequency band of the electromagnetic signal supplied to the input side conductor pattern, wherein, the step of forming the input side conductor pattern and the output side conductor pattern includes at least one of:

a step of forming at least a part of the input side conductor pattern so as to extend in the thickness direction; and a step of forming at least a part of the output side conductor pattern so as to extend in the thickness direction, and wherein, the step of forming the input side conductor pattern and the output side conductor pattern includes:

a step of selectively forming a pair of conductor patterns functioning as a part of the input side conductor pattern and a part of the output side conductor pattern at an interval on a surface of a first dielectric substrate, the surface being opposite to the other surface on which a first ground conductor pattern is formed;

a step of stacking a second dielectric substrate on the surface of the first dielectric substrate and combining the substrates to thereby form a single combined substrate;

a step of selectively forming a pair of wiring patterns made of a conductor at an interval on the surface of the second dielectric substrate in the combined substrate;

a step of forming a pair of through holes in the combined substrate so that the through holes allow each of the pair of conductor patterns to communicate with each of the pair of wiring patterns, respectively; and a step of forming a pair of conductor functioning as another part of the input side conductor pattern and another part of the output side conductor pattern in the pair of through holes, to thereby make a electrical connection between each of the pair of conductor patterns and each of the pair of wiring patterns.

2. A method of manufacturing a distributed constant filter according to claim 1, wherein a second ground conductive pattern is also formed, by one operation, on the surface of second dielectric substrate in the step of forming the wiring patterns on the surface of the second dielectric substrate.

3. A method of manufacturing a distributed constant filter according to claim 1, wherein the pair of through holes are formed by one of drilling, punching, and laser.

4. A method of manufacturing a distributed constant filter according to claim 1, wherein the pair of conductor parts are formed by a plating process.

5. The method of manufacturing a distributed constant filter according to claim 1, wherein the pair of conductor parts are formed by a printing process.

6. A method of manufacturing a distributed constant filter according to claim 1, wherein the step of forming the input side conductor pattern and the output side conductor pattern comprises:

a step of forming a pair of first through holes in a first dielectric substrate;

a step of selectively forming a pair of conductor patterns functioning as a part of the input side conductor pattern and a part of the output side conductor pattern on one of the surfaces of the first dielectric substrate and forming a pair of conductors functioning as another part of the input side conductor pattern and another part of the output side conductor pattern in the pair of first through holes;

a step of stacking a second dielectric substrate having a pair of second through holes formed in correspondence with the pair of first through holes of the first dielectric substrate on the surface on which the pair of conductor patterns are formed of the first dielectric substrates and combining both of the substrates to thereby for a single combined substrate; and a step of selectively forming a pair of wiring patterns made of a conductor at an interval on the surface of the second dielectric substrate in the combined substrate and forming another pair of conductors functioning as another part of the input side conductor pattern and another part of the output side conductor pattern in the pair of second through holes of the second dielectric substrate to thereby make electrical connections between each of the pair of conductor patterns formed on the surface of the first dielectric substrate and each of the pair of wiring patterns.

7. A method of manufacturing a distributed constant filter according to claim 6, wherein a third ground conductive pattern is also formed, by one operation, on the surface of the second dielectric substrate in the step of forming the wiring pattern on the surface of the second dielectric substrate.

8. A method of manufacturing a distributed constant filter according to claim 6, further comprising a step of forming a fourth ground conductive pattern on the other surface of the first dielectric substrate.

9. A method of manufacturing a distributed constant filter according to claim 6, wherein at least one of the pair of first through holes of the first dielectric substrate and the pair of second through holes of the second dielectric substrate are formed by one of drilling, punching, and laser.

10. A method of manufacturing a distributed constant filter according to claim 6, wherein at least one of the pair of conductors and the another pair of conductors is formed by a plating process.

11. A method of manufacturing a distributed constant filter according to claim 6, wherein at least one pair of conductors and the another pair of conductors is formed by a printing process.

12. A method of forming a distributed constatnt filter, comprising the steps of:

forming two relatively low impedance conductors on a first surface of a first substrate;

forming a conductive layers on an opposite surface of said substrates;

forming two conductor patterns on a first surface of a second substrate;

Securing an opposite surface of said second substrate to said first surface of said first substrate;

forming two relative high impedance conductor extending between said conductor patterns and said conductor layers and through said relatively low impedance conductors.

13. A method of manufacturing a distributed constant filter according claim 12, wherein the substrate is made of a ceramic material.

14. A method of manufacturing a distributed constant filter according to claim 12, wherein the substrate is made of an organic material.

15. The method of claim 12, wherein said low impedance conductors extend in a first direction, said high impedance conductors extend in a second direction orthogonal to said first direction, and said conductor patterns extend in a third direction orthogonal to said first direction.

16. The method of claim 15, wherein said second and third direction are orthogonal to each other.

17. The method of claim 12, wherein each of said conductor patterns includes a major portion and an extending tab portion, said high independence conductors being connected to respective extending tab portions.

* * * * *